(12) United States Patent
Kobayashi et al.

(10) Patent No.: US 12,317,685 B2
(45) Date of Patent: May 27, 2025

(54) DISPLAY DEVICE

(71) Applicant: SHARP KABUSHIKI KAISHA, Sakai (JP)

(72) Inventors: Fumiyuki Kobayashi, Sakai (JP); Tamotsu Sakai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 744 days.

(21) Appl. No.: 17/760,739

(22) PCT Filed: Sep. 30, 2019

(86) PCT No.: PCT/JP2019/038620
§ 371 (c)(1),
(2) Date: Mar. 15, 2022

(87) PCT Pub. No.: WO2021/064820
PCT Pub. Date: Apr. 8, 2021

(65) Prior Publication Data
US 2022/0344429 A1    Oct. 27, 2022

(51) Int. Cl.
*H10K 59/121*    (2023.01)
*H10K 59/131*    (2023.01)

(52) U.S. Cl.
CPC ..... *H10K 59/1216* (2023.02); *H10K 59/1213* (2023.02); *H10K 59/131* (2023.02)

(58) Field of Classification Search
CPC ...................... H10K 59/1216; H10K 59/1315
See application file for complete search history.

(56) References Cited

U.S. PATENT DOCUMENTS

2015/0062195 A1    3/2015    Kumeta et al.

FOREIGN PATENT DOCUMENTS

JP    2015-049335 A    3/2015

*Primary Examiner* — Amar Movva
(74) *Attorney, Agent, or Firm* — ScienBiziP, P.C.

(57) ABSTRACT

A display device includes: a plurality of pixel circuits each including a retention capacitor and a drive transistor. Each of those two of the plurality of pixel circuits which are adjacent in a row direction has a first opening in a capacitor line around a first contact hole in a plan view. A retention capacitor is at least partially provided in an overlapping region of a capacitor electrode and the capacitor line. The capacitor line has a second opening between two adjacent first openings and includes a first connecting line and a second connecting line opposite each other in a column direction across the second opening.

16 Claims, 10 Drawing Sheets

(a)

(b)

(a)

(b)

(c)

(a)

VARIATION EXAMPLE OF CAPACITOR LINE (b)

COMPARATIVE EXAMPLE OF CAPACITOR LINE (a)

(b)

(a)

(b) CAPACITOR LINE AS COMPARATIVE EXAMPLE

DISPLAY DEVICE

TECHNICAL FIELD

The disclosure relates to display devices.

BACKGROUND ART

Patent Literature 1 discloses a pixel circuit including: a drive transistor for controlling the luminance of a light-emitting element; a retention capacitor; and an initialization transistor, wherein the drive transistor has a gate electrode and a power supply line connected together via the retention capacitor.

CITATION LIST

Patent Literature

Patent Literature 1: Japanese Unexamined Patent Application Publication, Tokukai, No. 2015-49335

SUMMARY

Technical Problem

A high wiring resistance of the power supply line can cause variations in the power supply voltage and adversely affect the control of the luminance of the light-emitting element.

Solution to Problem

The disclosure, in an aspect thereof, is directed to a display device including: a plurality of pixel circuits each including a retention capacitor, a drive transistor, and an initialization transistor; a semiconductor layer; a gate insulation film; a first wiring layer; a first inorganic insulation film; a second wiring layer; a second inorganic insulation film; and a third wiring layer, wherein each of the plurality of pixel circuits includes: a capacitor electrode corresponding to the drive transistor; and a connection line electrically connected to one of conductive terminals of the initialization transistor, those two of the plurality of pixel circuits which are adjacent in a row direction share a capacitor line, the first wiring layer includes the capacitor electrode, the second wiring layer includes the capacitor line, the third wiring layer includes the connection line, the connection line is electrically connected to the capacitor electrode via a first contact hole in the first inorganic insulation film and the second inorganic insulation film, each of the two of the plurality of pixel circuits has a first opening in the capacitor line around the first contact hole in a plan view, the retention capacitor is at least partially provided in an overlapping region of the capacitor electrode and the capacitor line, and the capacitor line has a second opening between those two of the first openings which are adjacent to each other and includes a first connecting line and a second connecting line opposite each other in a column direction across the second opening.

Advantageous Effects of Invention

The disclosure, in an aspect thereof, reduces the wiring resistance of capacitor lines.

DESCRIPTION OF EMBODIMENTS

Embodiment 1

Figure 1:
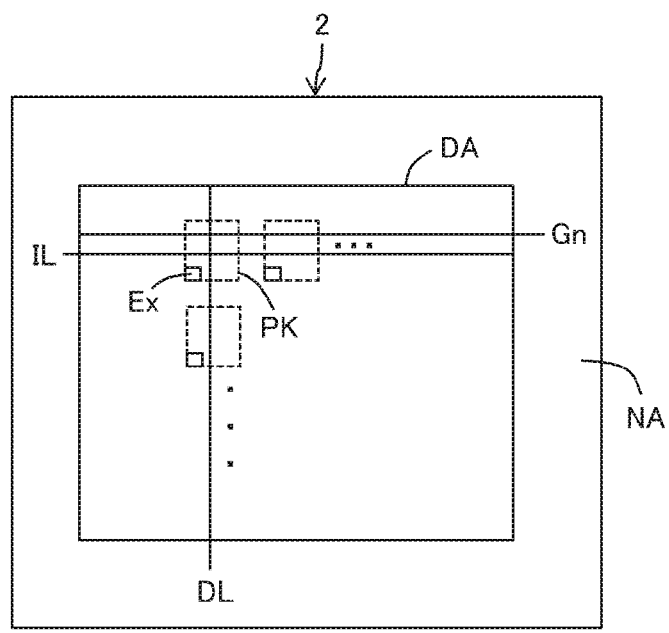
FIG. 1(a) is a plan view of a structure of a display device in accordance with Embodiment 1.
FIG. 1(b) is a cross-sectional view of the structure of the display device in accordance with Embodiment 1.
Figure 1:
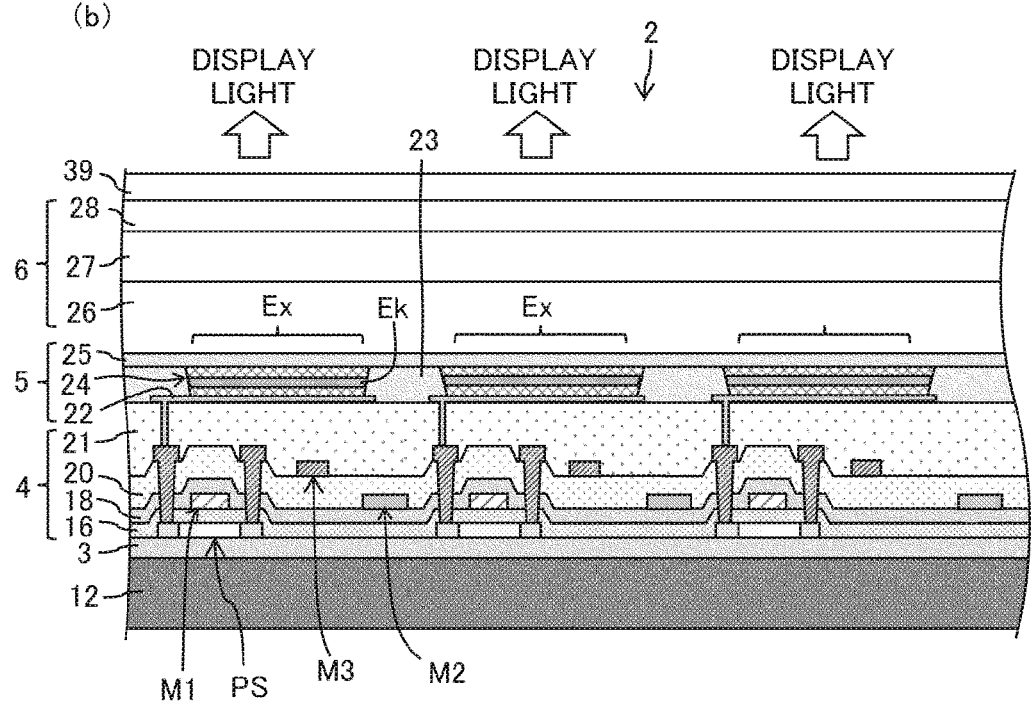

FIG. 1(a) is a schematic view of a structure of a display device in accordance with Embodiment 1. FIG. 1(b) is a cross-sectional view of the structure of the display device in accordance with Embodiment 1. Referring to FIG. 1, a display device 2 includes a barrier layer 3, a thin film transistor layer 4, a top-emission (light is emitted toward an upper layer) light-emitting element layer 5, and a sealing layer 6, all of which are provided on a substrate 12 in this order. The display device 2 has a display area DA where there are provided: a plurality of pixel circuits PK1 and PK2 each including a light-emitting element Ex; and a plurality of lines (including scan signal lines Gn, data signal lines DL, and capacitor lines CS). There are provided, for example, terminal sections and various drivers in a frame area NA surrounding the display area DA.

The substrate 12 is a glass substrate or a flexible base member composed primarily of a polyimide or other like resin. The substrate 12 may include, for example, two polyimide films and an inorganic film sandwiched between these polyimide films. The barrier layer (undercoat layer) 3 is an inorganic insulation layer for preventing foreign objects such as water and oxygen from reaching inside and may contain, for example, silicon nitride or silicon oxide.

The thin film transistor layer 4 includes: a semiconductor layer PS overlying the barrier layer 3; a gate insulation film 16 overlying the semiconductor layer PS; a first wiring layer M1 (containing the scan signal lines Gn) overlying the gate insulation film 16; a first inorganic insulation film 18 overlying the first wiring layer M1; a second wiring layer M2 (containing capacitor lines and initialization power supply lines IL) overlying the first inorganic insulation film 18; a second inorganic insulation film 20 overlying the second wiring layer M2; a third wiring layer M3 (containing the data signal lines DL) overlying the second inorganic insulation film 20; and a planarization film 21 overlying the third wiring layer M3.

The semiconductor layer PS is, for example, a low-temperature polysilicon (LTPS). A transistor is structured including the gate insulation film 16 sandwiched between a gate electrode in the first wiring layer M1 and a channel of the semiconductor layer PS. The semiconductor layer PS may be a conductor, except for the channel of the transistor.

The first wiring layer, the second wiring layer, and the third wiring layer are made of, for example, a monolayer or multilayer film of at least one of metals of aluminum, tungsten, molybdenum, tantalum, chromium, titanium, and copper.

The gate insulation film 16, the first inorganic insulation film 18, and the second inorganic insulation film 20 may be made of, for example, a silicon oxide (SiOx) film or a silicon nitride (SiNx) film formed by CVD or a stack of these films. The planarization film 21 may be made of, for example, an organic material such as a polyimide or acrylic resin, that can be provided by printing or coating technology.

The light-emitting element layer 5 includes: a first electrode (lower electrode) 22 overlying the planarization film 21; an insulating edge cover film 23 covering the edge of the first electrode 22; an EL (electroluminescence) layer 24 overlying the edge cover film 23; and a second electrode (upper electrode) 25 overlying the EL layer 24. The edge cover film 23 is formed, for example, by patterning an applied organic material such as a polyimide or acrylic resin by photolithography.

The light-emitting element layer 5 includes, for example, the light-emitting elements Ex that emit light of different colors. Each light-emitting element includes the insular first electrode 22, the EL layer 24 (including a light-emitting layer Ek) and the second electrode 25. The second electrode 25 is a common electrode provided commonly to a plurality of light-emitting elements across the display area DA.

The light-emitting element Ex may be, for example, an OLED (organic light-emitting diode) including an organic layer as a light-emitting layer or a QLED (quantum-dot light-emitting diode) including a quantum-dot layer as a light-emitting layer.

The EL layer 24 includes, for example, a stack of a hole injection layer, a hole transport layer, the light-emitting layer Ek, an electron transport layer, and an electron injection layer, all of which are provided in this order when viewed from below. The light-emitting layer is provided in openings in the edge cover film 23 (for each subpixel) in an insular manner by vapor deposition, inkjet technology, or photolithography. The other layers are provided in an insular manner or across the display area (as a common layer). One or more of the hole injection layer, the hole transport layer, the electron transport layer, and the electron injection layer may be omitted.

The first electrode 22 (anode) includes, for example, a stack of ITO (indium tin oxide) and either Ag (silver) or a Ag-containing alloy, so that the first electrode 22 can reflect light. The second electrode 25 (cathode) may be made of, for example, a thin film of a metal such as a magnesium-silver alloy, so that the second electrode 25 can transmit light.

If the light-emitting element Ex is an OLED, holes and electrons recombine in the light-emitting layer Ek owing to the drive current flowing between the first electrode 22 and the second electrode 25, to produce excitons that fall to the ground state to emit light. If the light-emitting element Ex is an QLED, holes and electrons recombine in the light-emitting layer Ek owing to the drive current flowing between the first electrode 22 and the second electrode 25, to produce excitons that transit from the conduction band energy level (conduction band) to the valence band energy level (valence band) of quantum dots to emit light.

The sealing layer 6, covering the light-emitting element layer 5, prevents foreign objects such as water and oxygen from reaching the light-emitting element layer 5 and may include, for example, two inorganic sealing films 26 and 28 and an organic film 27 sandwiched between the inorganic sealing films.

A functional film 39 has, for example, at least one of a touch sensor function, an optical compensation function, and a protection function.

Figure 2:
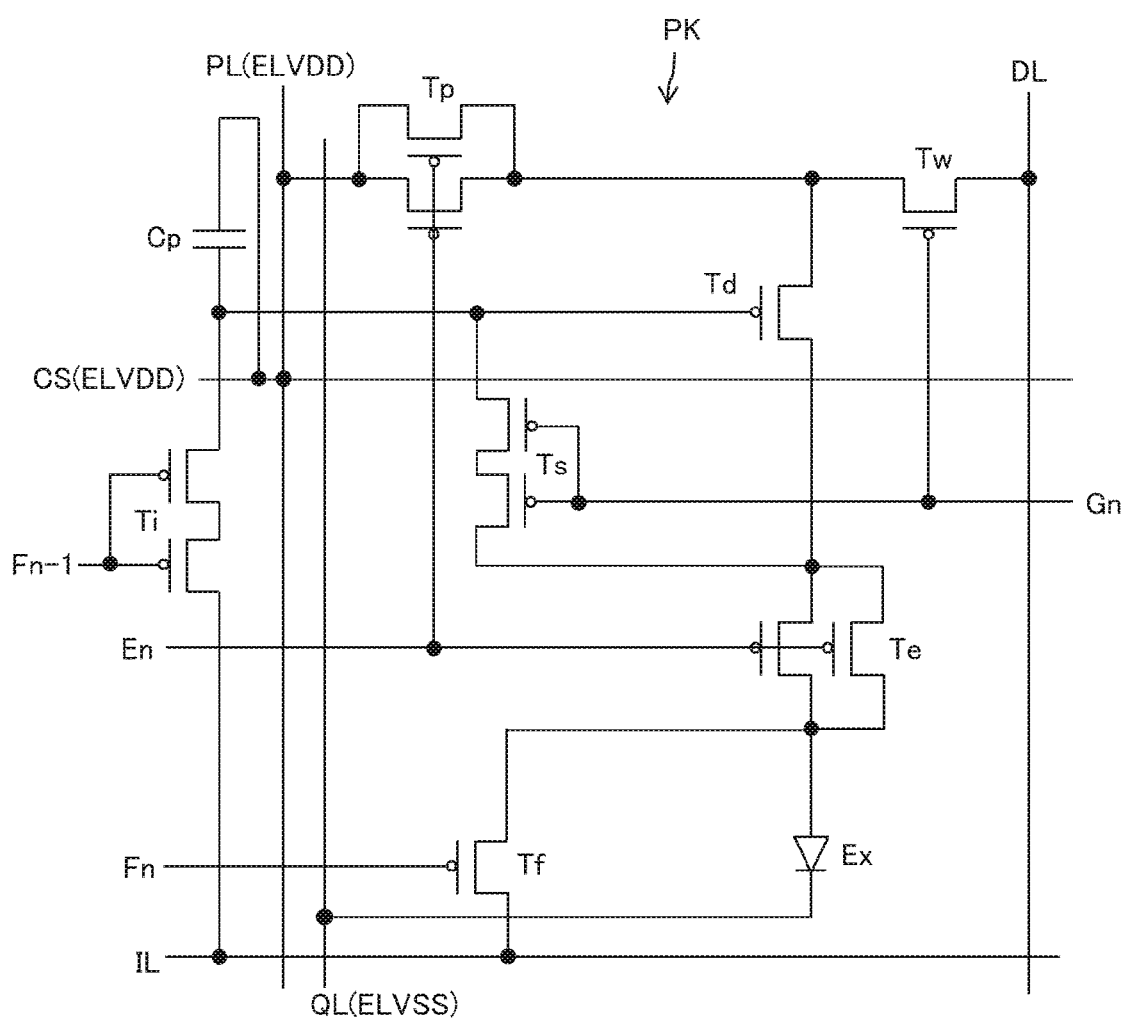
FIG. 2 is a circuit diagram of a pixel circuit in accordance with Embodiment 1.
Figure 3:
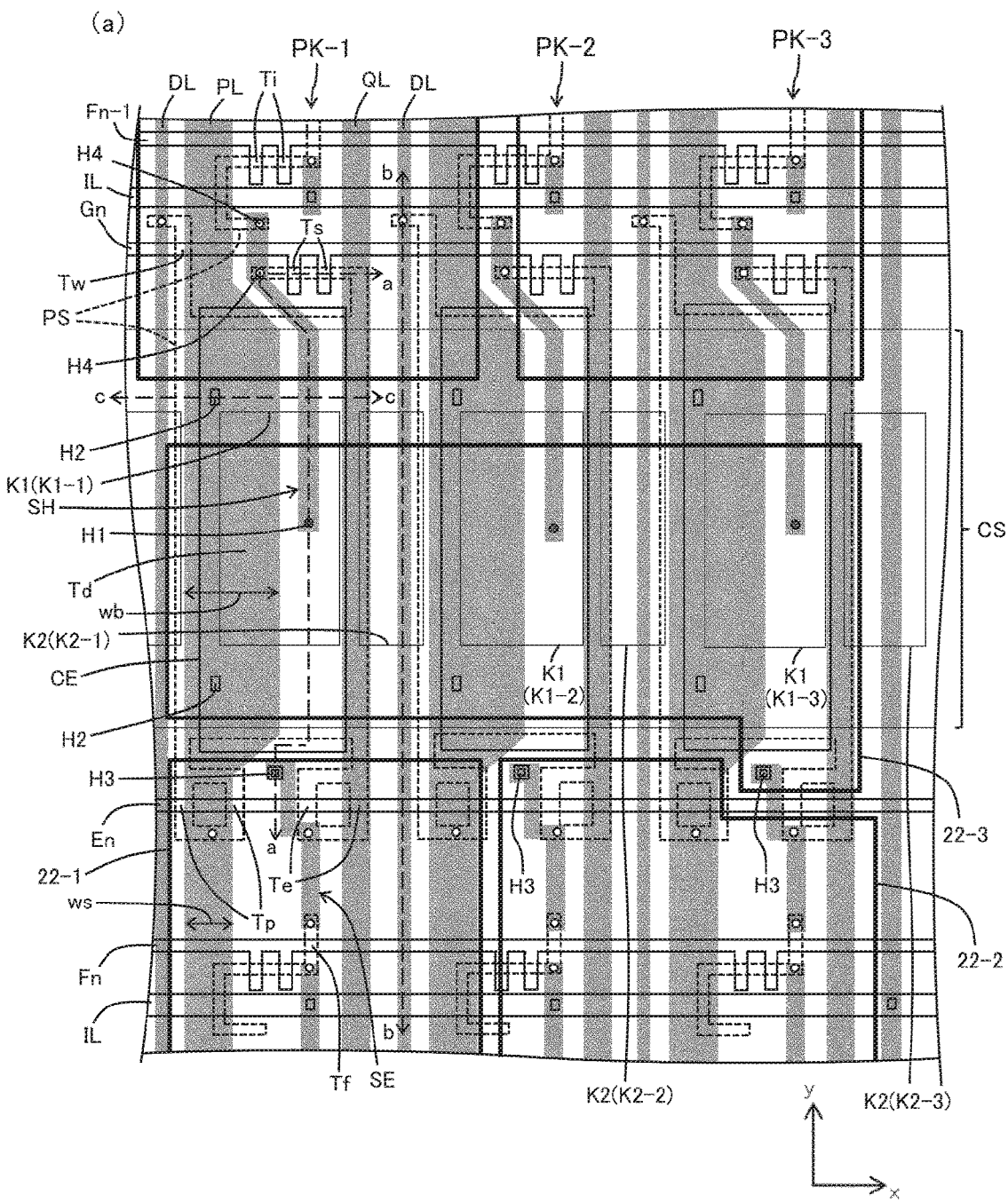
FIG. 3(a) is a plan view of a structure of the pixel circuit.
FIG. 3(b) is a plan view of a structure of a capacitor line.
Figure 3:
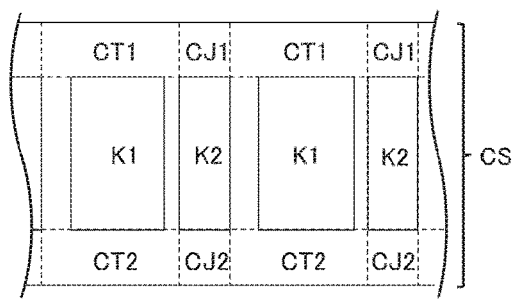

FIG. 2 is a circuit diagram of a pixel circuit PK. FIG. 3(a) is a plan view of a structure of the pixel circuit PK, and FIG. 3(b) is a plan view of a structure of a capacitor line. FIG. 4(a) is a cross-sectional view taken along line a-a shown in FIG. 3, FIG. 4(b) is a cross-sectional view taken along line b-b shown in FIG. 3, and FIG. 4(c) is a cross-sectional view taken along line c-c shown in FIG. 3. FIG. 5(a) is a plan view of a retention capacitor, and FIG. 5(b) is a plan view of a drive transistor.

FIG. 3 shows three pixel circuits PK (PK-1, PK-2, and PK-3) from left to right. In the following description, the designations "-1," "-2," and "-3" may be used to indicate an association with a first subpixel, a second subpixel, and a third subpixel respectively. Each pixel circuit PK is either a first subpixel, a second subpixel, or a third subpixel. These subpixels independently emit, for example, red, green, and blue light respectively to operate as a single pixel for a color display. Those first electrodes 22 which are associated with the first subpixels, the second subpixels, and the third subpixels are denoted by 22-1, 22-2, and 22-3 respectively in FIG. 3(a).

Each pixel circuit PK includes: the light-emitting element Ex; a retention capacitor Cp; an initialization transistor Ti having a gate electrode connected to a discharge control line Fn−1 of a preceding stage; a threshold value control transistor Ts having a gate electrode connected to the scan signal line Gn of the current stage; a write control transistor Tw having a gate electrode connected to the scan signal line Gn of the current stage; a drive transistor Td; a power supply transistor Tp having a gate electrode connected to a light-emission control line En of the current stage; a light emission control transistor Te having a gate electrode connected to the light-emission control line En of the current stage; and a discharge transistor Tf having a gate electrode connected to the discharge control line Fn of the current stage.

The discharge control lines Fn−1 and Fn, the scan signal lines Gn, and the light-emission control lines En extend in the row direction (x-direction). These lines are provided in the first wiring layer M1, in the second wiring layer M2, or in both the first wiring layer M1 and the second wiring layer M2. If the lines are provided in the second wiring layer M2, at least those parts which serve as gate electrodes are reconnected to the first wiring layer M1. The present embodiment includes stacked lines (lower lines and upper lines) provided in both the first wiring layer M1 and the second wiring layer M2 to sandwich the first inorganic insulation film as shown in FIGS. 4(a) and 4(b). The lower and upper lines are electrically connected via contact holes (not shown).

The initialization transistor Ti includes two series-connected p-type transistors with the gate electrodes thereof being electrically connected to each other. The threshold value control transistor Ts includes two series-connected p-type transistors with the gate electrodes thereof being electrically connected to each other. The power supply transistor Tp includes two parallel-connected p-type transistors with the gate electrodes thereof being electrically connected to each other. The light emission control transistor Te includes two parallel-connected p-type transistors with the gate electrodes thereof being electrically connected to each other. The write control transistor Tw, the drive transistor Td, and the discharge transistor Tf are all p-type transistors.

The gate electrode of the drive transistor Td is connected to the capacitor line CS via a capacitive element Cp and to the initialization power supply line IL via the initialization transistor Ti.

The source electrode of the drive transistor Td is connected to the data signal line DL via the write control transistor Tw and to a first power supply line PL via the power supply transistor Tp. The drain electrode of the drive transistor Td is connected to the anode of the light-emitting element Ex via the light emission control transistor Te and to the gate electrode of the drive transistor Td via the threshold value control transistor Ts. The anode of the light-emitting element Ex is connected to the initialization power supply line IL via the discharge transistor Tf. The cathode of the light-emitting element Ex is electrically connected to a low-voltage (ELVSS), second power supply line QL.

The initialization power supply lines IL are provided in the second wiring layer M2 and extend in the row direction (x-direction). The data signal lines DL, the first power supply lines PL, and the second power supply lines QL are all provided in the third wiring layer M3 and extend in the column direction (y-direction).

The pixel circuit PK includes a connection line SH electrically connecting a capacitor electrode CE provided in association with the drive transistor Td to one of the two conductive terminals of the initialization transistor Ti (conductive regions of the semiconductor layer PS). The pixel circuit PK further includes a connection electrode SE electrically connecting one of the two conductive terminals of the discharge transistor Tf to one of the two conductive terminals of the light emission control transistor Te. The connection electrode SE is electrically connected to the first electrode 22 as will be described later in detail. The capacitor electrode CE serves additionally as the gate electrode (control electrode) of the drive transistor Td.

The three pixel circuits PK-1, PK-2, and PK-3, which are adjacent to each other in the row direction (x-direction), share the capacitor line CS. The capacitor electrodes CE are contained in the first wiring layer M1, the capacitor lines CS are contained in the second wiring layer M2, and the connection lines SH and the connection electrodes SE are contained in the third wiring layer M3.

The connection line SH electrically connects to the capacitor electrode CE via a first contact hole H1 in the first inorganic insulation film 18 and the second inorganic insulation film 20 and to one of the conductive terminals of the threshold value control transistor Ts via a fourth contact hole H4 in the gate insulation film 16, the first inorganic insulation film 18, and the second inorganic insulation film 20 (conductive regions of the semiconductor layer PS). The connection line SH further electrically connects to one of the conductive terminals of the initialization transistor Ti via the fourth contact hole H4 (conductive regions of the semiconductor layer PS).

The capacitor line CS is connected to the high-voltage (ELVDD), first power supply line PL via a second contact hole H2 in the second inorganic insulation film 20, to serve as an ELVDD line. The connection electrode SE is electrically connected to the first electrode 22 (anode of the light-emitting element Ex) via a third contact hole H3 in the planarization film 21.

The capacitor line CS passing through the pixel circuits PK-1, PK-2, and PK-3 has a first opening K1 around the first contact hole H1 in a plan view and includes the retention capacitor Cp in an overlapping region of the capacitor electrode CE and the capacitor line CS (indicated by hatching in FIG. 5(a)).

Figure 4:
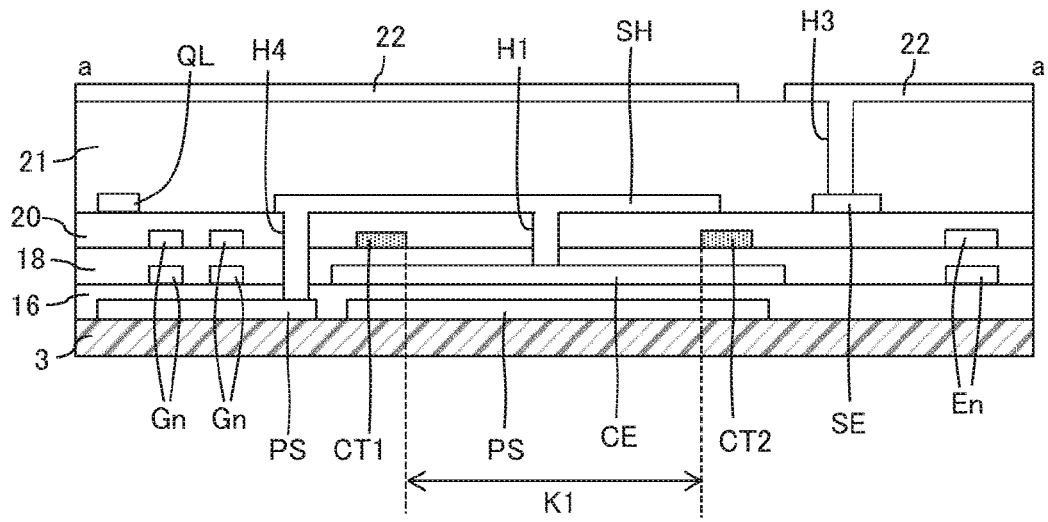
FIG. 4(a) is a cross-sectional view taken along line a-a shown in FIG. 3.
FIG. 4(b) is a cross-sectional view taken along line b-b shown in FIG. 3.
FIG. 4(c) is a cross-sectional view taken along line c-c shown in FIG. 3.
Figure 4:
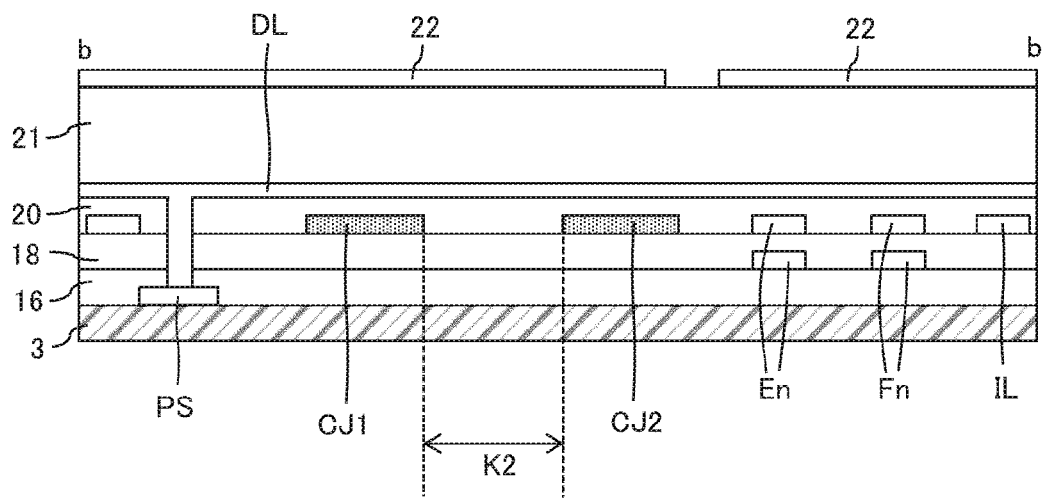
Figure 4:
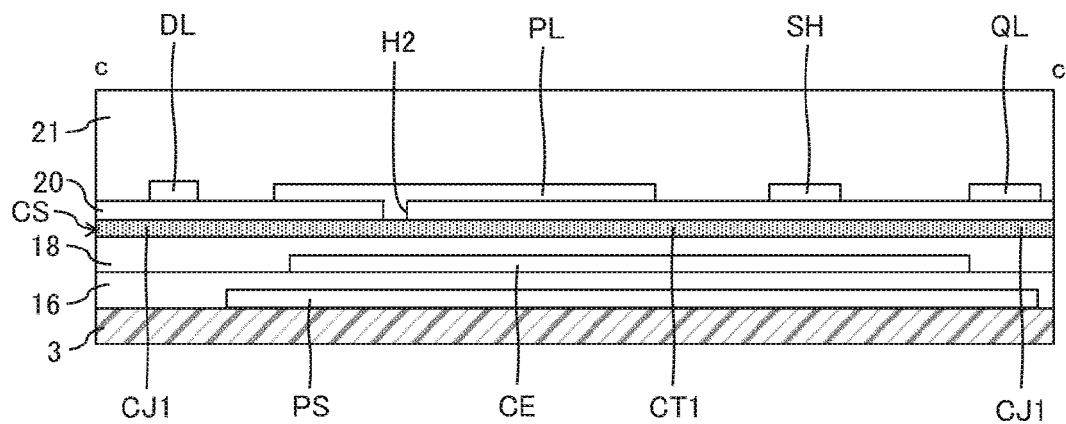

Referring to FIGS. 3(b) and 4, the ladder-shaped capacitor line CS has a second opening K2 between those two first openings K1 which are adjacent to each other and includes a first connecting line CJ1 and a second connecting line CJ2 located opposite each other in the column direction (y-direction) across the second opening K2. In FIG. 3(b), the left one of the first openings K1 (K1-1) is associated with the first subpixel, and the right one of the first openings K1 (K1-2) is associated with the second subpixel. The second opening K2 (K2-1) to the left is sandwiched between the first opening K1 (K1-1) of the first subpixel and the first opening K1 (K1-2) of the second subpixel, and the second opening K2 (K2-2) to the right is sandwiched between the first opening K1 (K1-2) of the second subpixel and the first opening K1 (K1-3) of the third subpixel.

Referring to FIG. 3, the capacitor line CS includes a first opposing portion CT1 and a second opposing portion CT2 located outside the first opening K1 and opposite each other in the column direction. The external edge (outer face) of the first connecting line CJ1 sits flush with the external edges (outer faces) of the two first opposing portions CT1 that are adjacent in the row direction to the first connecting line CJ1, and the external edge (outer face) of the second connecting line CJ2 sits flush with the external edges (outer faces) of the two second opposing portions CT2 that are adjacent in the row direction to the second connecting line CJ2. The term "flush" indicates that the outer faces of the two lines have no level difference therebetween and hence form a flat face. The first connecting line CJ1 and the first opposing portion CT1 have an equal width (dimension in the y-direction), and the second connecting line CJ2 and the second opposing portion CT2 have an equal width.

The first power supply line PL has a width wb in a portion thereof that overlaps the first opening K1 and a width ws in a portion thereof that corresponds to a gap between the two pixel circuits that are adjacent in the column direction, wb being larger than ws. This particular structure reduces both parasitic capacitance and the wiring resistance of the first power supply line PL that carry a large electric current. The data signal line DL overlaps the second opening K2. This particular structure, not overlapping the region corresponding to the total width of the capacitor line CS, reduces parasitic capacitance, thereby reducing signal ripping.

Figure 5:
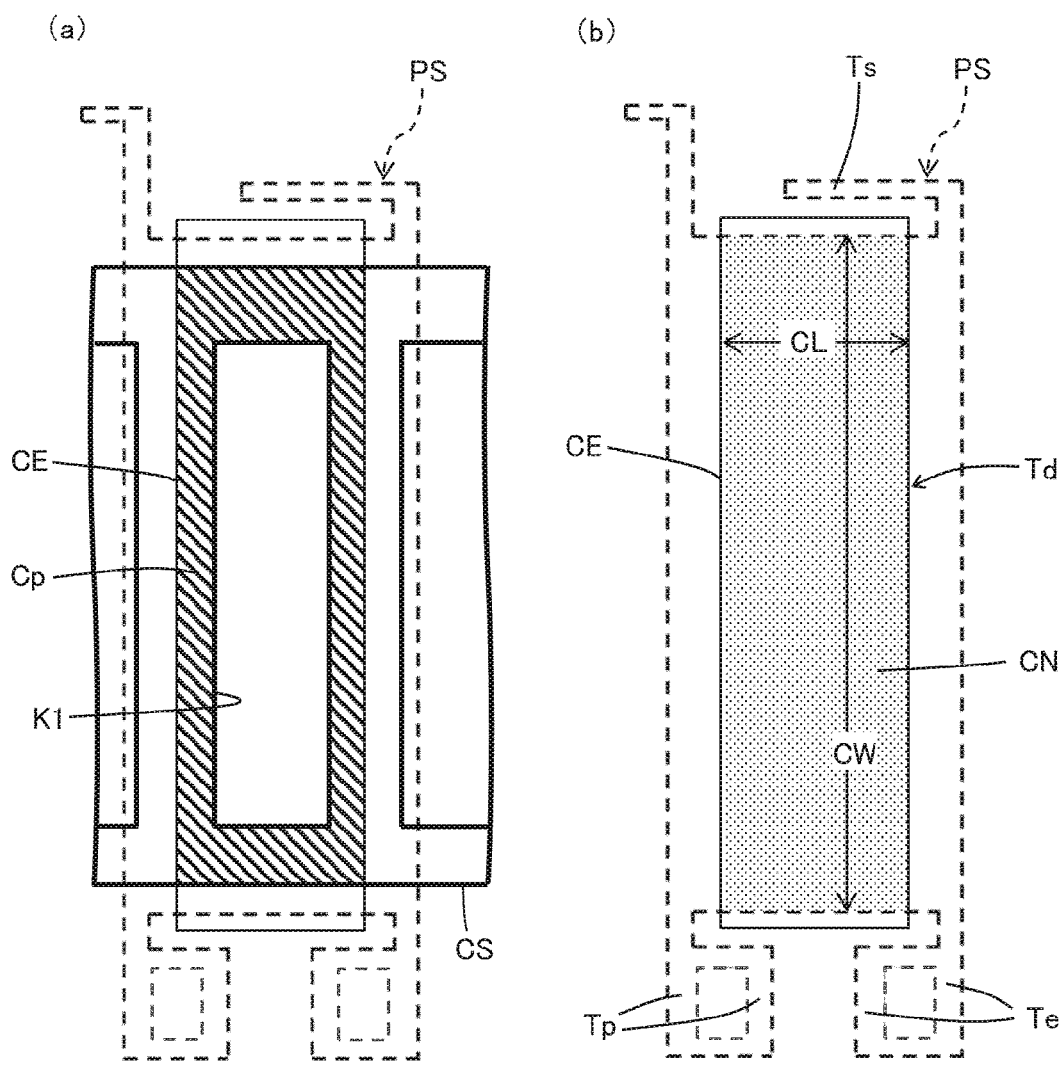
FIG. 5(a) is a plan view of a retention capacitor.
FIG. 5(b) is a plan view of a drive transistor.

As shown in FIGS. 4 and 5, the channel CN of the drive transistor Td (overlapping region of the semiconductor layer PS and the capacitor electrode CE) has a larger channel width CW (dimension in the column direction) than a channel length CL (dimension in the row direction) (e.g., CW>CL×2). The capacitor electrode CE is rectangular and has a larger dimension in the channel width direction (column direction) than in the channel length direction (row direction). This particular structure allows for a large current supply to the drive transistor Td.

Figure 6:
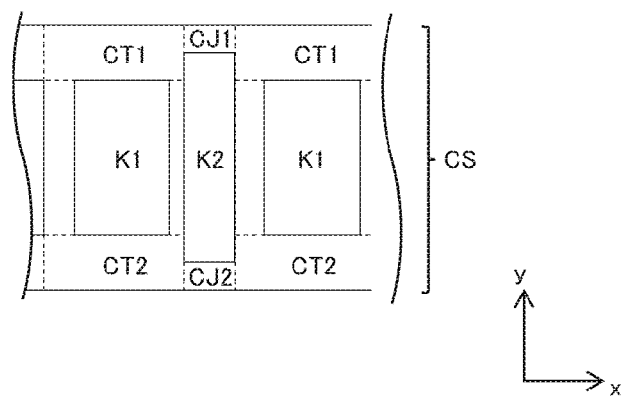
FIG. 6(a) is a plan view of a variation example of the capacitor line.
FIG. 6(b) is a plan view of a comparative example of the capacitor line.
Figure 6:
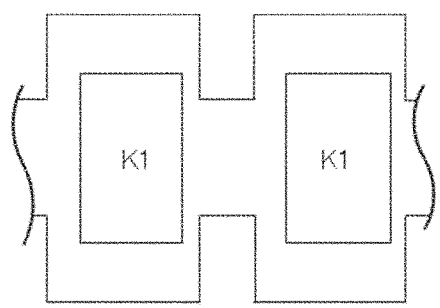

FIG. 6(a) is a plan view of a variation example of the capacitor line, and FIG. 6(b) is a plan view of a comparative example of the capacitor line. The provision of the first connecting line CJ1 and the second connecting line CJ2 as shown in FIG. 6(b) reduces the wiring resistance of the capacitor line CS more than the comparative example where parts of the external edges of the capacitor line are dented inward. That in turn stabilizes the electrical potential on the capacitor line CS (ELVDD) even when a large electric current is supplied to the drive transistor Td.

FIG. 3(b) depicts the first connecting line CJ1 and the first opposing portion CT1 as having an equal width (dimension in the y-direction) and the second connecting line CJ2 and the second opposing portion CT2 as having an equal width (dimension in the y-direction). Alternatively, the first connecting line CJ1 may have a smaller width (dimension in the y-direction) than the first opposing portion CT1, and the second connecting line CJ2 may have a smaller width (dimension in the y-direction) than the second opposing portion CT2, as shown in FIG. 6(a), to reduce the parasitic capacitance between the data signal line DL and the capacitor line CS.

Embodiment 2

Figure 7:
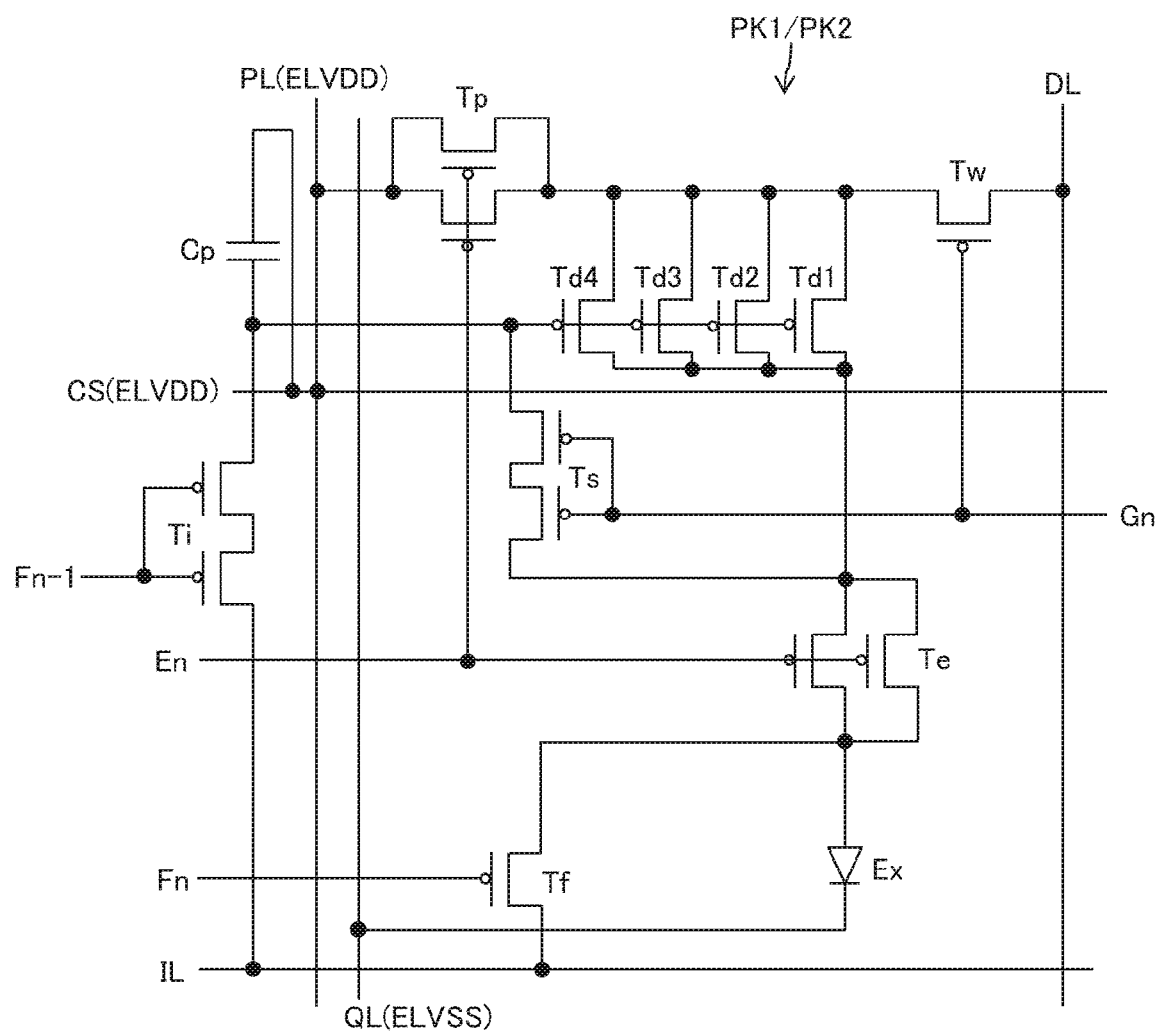
FIG. 7 is a circuit diagram of a pixel circuit in accordance with Embodiment 2.

FIG. 7 is a circuit diagram of a pixel circuit in accordance with Embodiment 2. FIG. 8(a) is a plan view of a structure of the pixel circuit, and FIG. 8(b) is a plan view of a structure of a capacitor line. FIG. 9(a) is a plan view of a retention capacitor, and FIG. 9(b) is a plan view of a plurality of drive transistors. Each pixel circuit (PK1 and PK2) in accordance with Embodiment 2 includes: a plurality of parallel-connected drive transistors (first transistor Td1, second transistor Td2, third transistor Td3, and fourth transistor Td4); and a plurality of capacitor electrodes CE1 to CE4 associated respectively with the first transistor Td1 to the fourth transistor Td4. Those two pixel circuits PK1 and PK2 which are adjacent to each other in the row direction share four capacitor lines CS1 to CS4 overlapping the capacitor electrodes CE1 to CE4 respectively.

Specifically, the initialization transistor Ti has one of the two conductive terminals thereof electrically connected to the connection line SH. The capacitor electrodes CE1 to CE4, which line up in the column direction, are electrically connected to the connection line SH via four contact holes H1.

There is provided a capacitor C1 in an overlapping region of the capacitor electrode CE1 (gate electrode of the first transistor Td1) and the capacitor line CS1. The capacitor electrode CE2 (gate electrode of the second transistor Td2) overlaps the capacitor line CS2. The capacitor electrode CE3 (gate electrode of the third transistor Td3) overlaps the capacitor line CS3. The capacitor electrode CE4 (gate electrode of the fourth transistor Td4) overlaps the capacitor line CS4.

The capacitor line CS1, the capacitor line CS2, the capacitor line CS3, and the capacitor line CS4 are electrically connected to the first power supply line PL via the second contact holes H2. Referring to FIG. 9(a), the retention capacitor Cp of the pixel circuit PK is formed by combining the capacitor C1 formed in an overlapping region of the capacitor electrode CE1 and the capacitor line CS1 (indicated by hatching in FIG. 9(a)), a capacitor C2 formed in an overlapping region of the capacitor electrode CE2 and the capacitor line CS2 (indicated by hatching in FIG. 9(a)), a capacitor C3 formed in an overlapping region of the capacitor electrode CE3 and the capacitor line CS3 (indicated by hatching in FIG. 9(a)), and a capacitor C4 formed in an overlapping region of the capacitor electrode CE4 and the capacitor line CS4 (indicated by hatching in FIG. 9(a)) (by connecting the four capacitors C1 to C4 in parallel).

Figure 8:
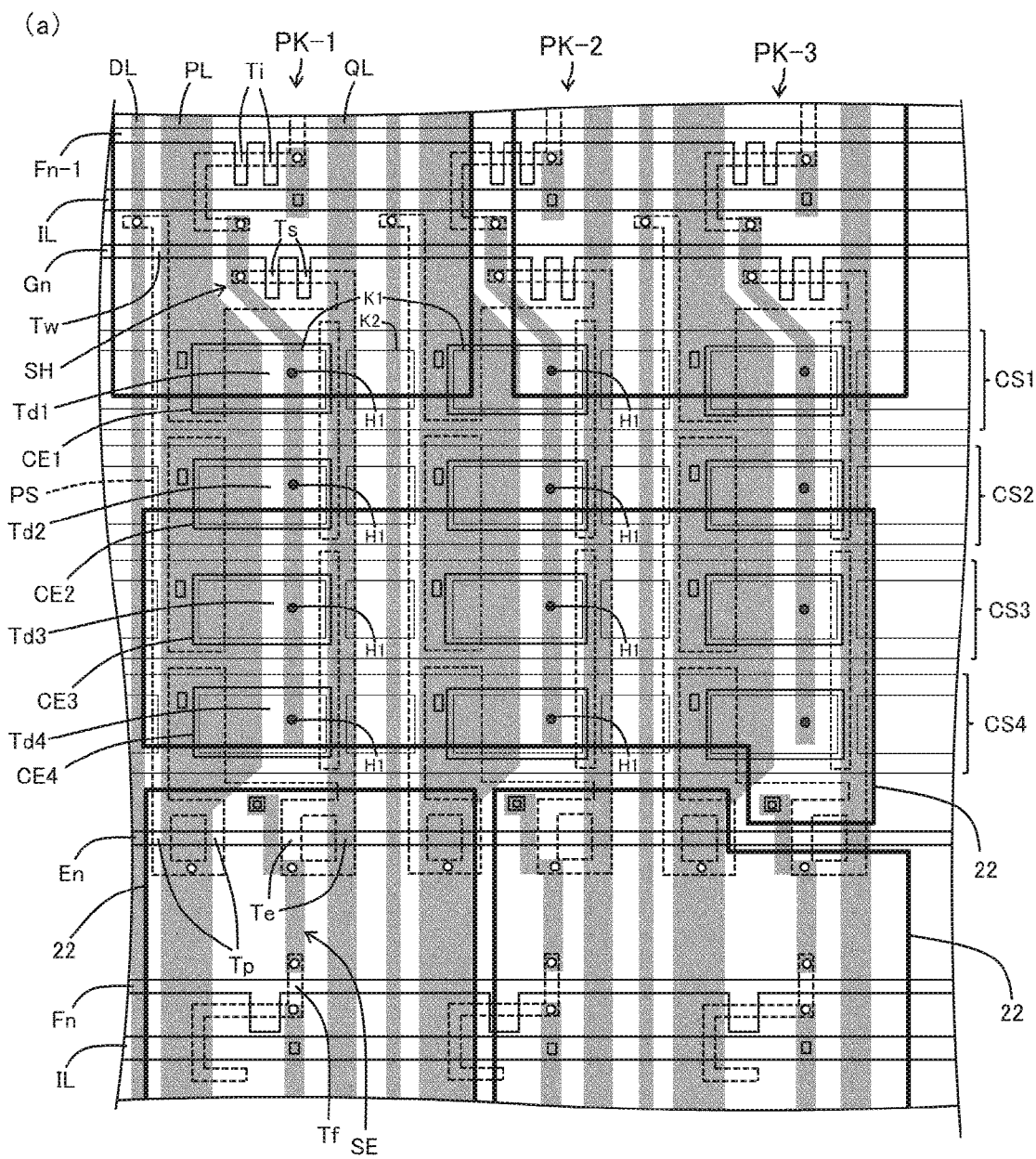
FIG. 8(a) is a plan view of a structure of the pixel circuit.
FIG. 8(b) is a plan view of a structure of a capacitor line.
Figure 8:
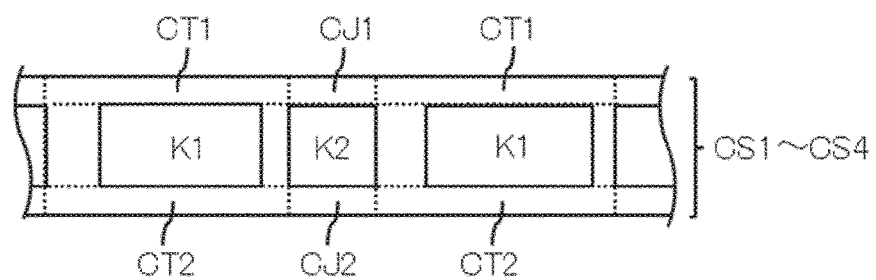

Referring to FIG. 8, the ladder-shaped capacitor line CS1 has a first opening K1 around the first contact hole H1 in a plan view and a second opening K2 between those two first openings K1 which are adjacent to each other and includes a first connecting line CJ1 and a second connecting line CJ2 located opposite each other in the column direction (y-direction) across the second opening K2.

The capacitor line CS1 includes a first opposing portion CT1 and a second opposing portion CT2 located outside the first opening K1 and opposite each other in the column direction. The external edge (outer face) of the first connecting line CJ1 sits flush with the external edge (outer face) of the first opposing portion CT1 that is adjacent in the row direction to the first connecting line CJ1, and the external edge (outer face) of the second connecting line CJ2 sits flush with the external edge (outer face) of the second opposing portion CT2 that is adjacent in the row direction to the second connecting line CJ2. The first connecting line CJ1 and the first opposing portion CT1 have an equal width (dimension in the y-direction; e.g., 4.5 μm), and the second connecting line CJ2 and the second opposing portion CT2 have an equal width (e.g., 4.5 μm).

The first power supply line PL has a larger width in a portion thereof that overlaps the first opening K1 than in a portion thereof that corresponds to a gap between the two pixel circuits that are adjacent in the column direction. The data signal line DL overlaps the second opening K2.

Figure 9:
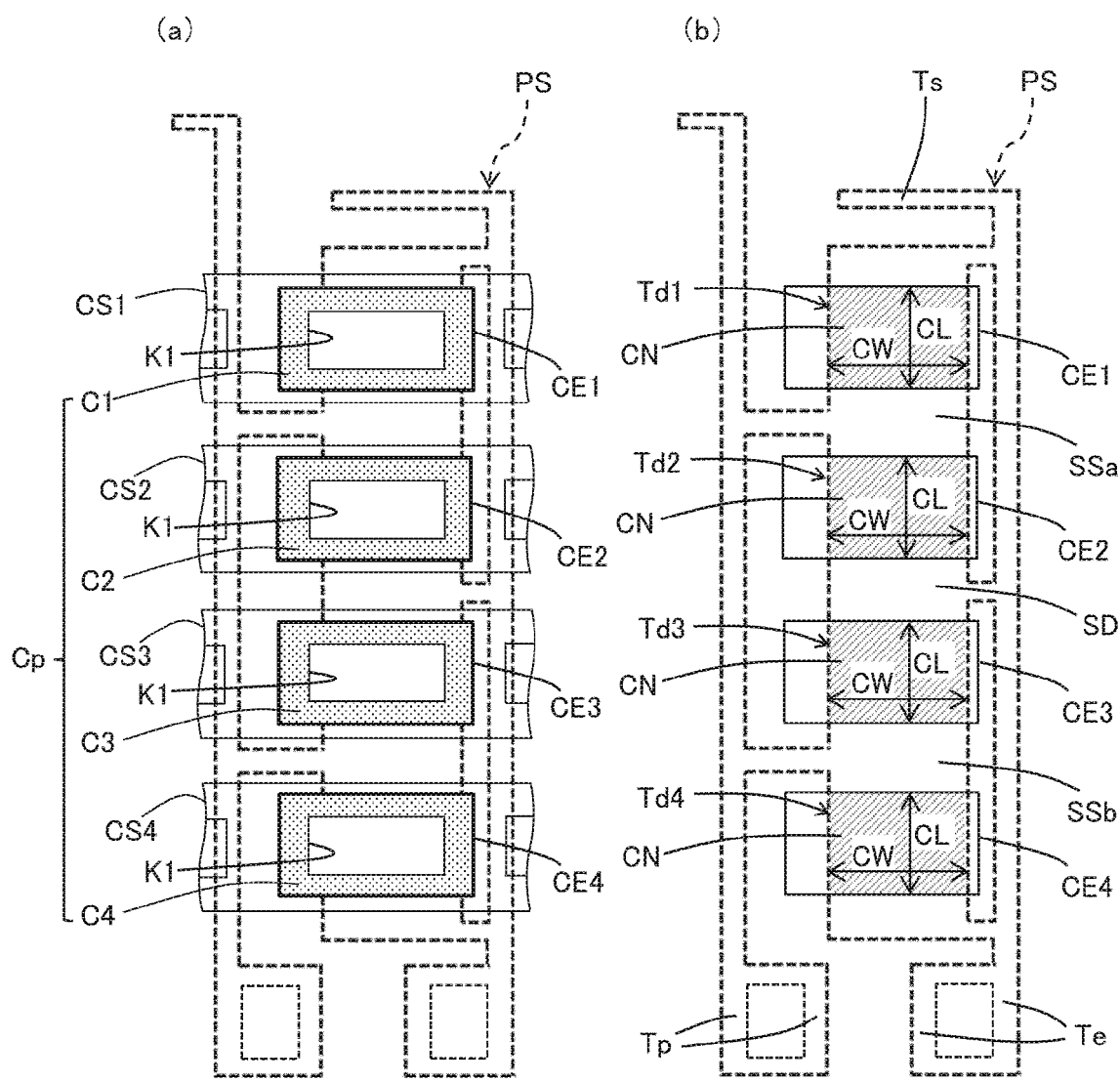
FIG. 9(a) is a plan view of a retention capacitor.
FIG. 9(b) is a plan view of a plurality of drive transistors.

Referring to FIGS. 8 and 9, the channel CN of the drive transistor Td1 (overlapping region of the semiconductor layer PS and the capacitor electrode CE1) has a larger channel width CW (dimension in the column direction; e.g., 22.7 μm) than a channel length CL (dimension in the row direction; e.g., 20.5 μm). The capacitor electrode CE1 is rectangular and has a larger dimension in the channel width direction (column direction) than in the channel length direction (row direction). The first opening K1 is rectangular and has a larger dimension in the channel width direction (e.g., 30.1 μm) than in the channel length direction (e.g., 14.5 μm).

The capacitor electrodes CE2 to CE4 have the same structure as the capacitor electrode CE1. The capacitor lines CS2 to CS4 have the same structure as the capacitor line CS1. The second transistor Td2 to the fourth transistor Td4 have the same structure as the first transistor Td1.

The parallel-connected, first to fourth transistors Td1 to Td4, which line up in the column direction, have the gate electrodes thereof connected together, the source electrodes thereof connected together, and the drain electrodes thereof connected together. Specifically, the first transistor Td1 and the second transistor Td2 share a source region SSa in the semiconductor layer PS. The second transistor Td2 and the third transistor Td3 share a drain region SD in the semiconductor layer PS. The third transistor Td3 and the fourth transistor Td4 share a source region SSb in the semiconductor layer PS. This particular structure allows for a large current supply to the first to fourth transistors Td1 to Td4.

The provision of the first connecting line CJ1 and the second connecting line CJ2 to the capacitor lines CS1 to CS4 as shown in FIG. 7(b) reduces the wiring resistance of the capacitor lines CS1 to CS4 more than the comparative example shown in FIG. 9. That in turn stabilizes the electrical potential on the capacitor lines CS1 to CS4 (ELVDD) even when a large electric current is supplied to the first to fourth transistors Td1 to Td4.

Figure 10:
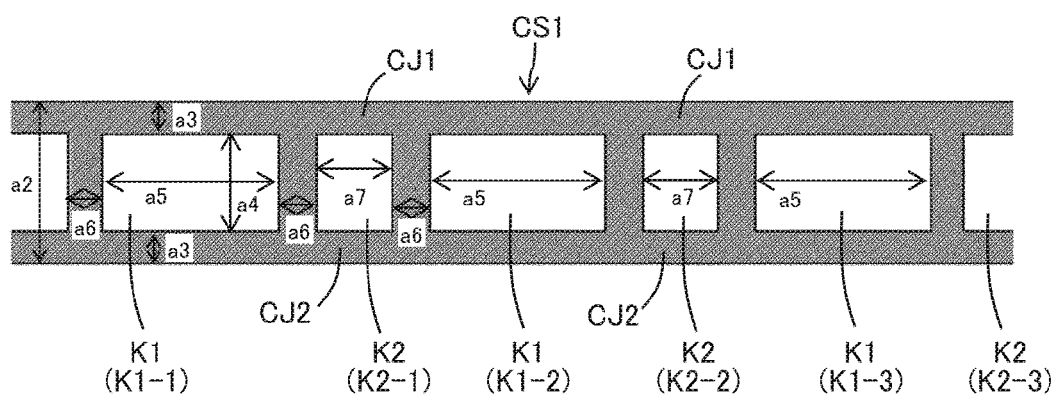
FIG. 10(a) is a plan view of a capacitor line in accordance with Embodiment 2.
FIG. 10(b) is a plan view of a capacitor line in accordance with a comparative example.
Figure 10:
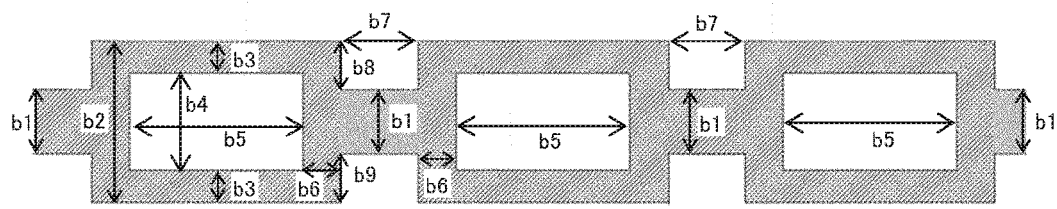

FIG. 10(a) is a plan view of a capacitor line in accordance with Embodiment 2, and FIG. 10(b) is a plan view of a capacitor line in accordance with a comparative example. The resistance value of the capacitor line CS1 in accordance with Embodiment 2 is reduced by approximately 5% over the resistance value of the capacitor line in accordance with the comparative example, for example, by setting a2=b2, a3=b3, a4=b4, a5=b5, a6=b6, a7=b7, b1+b8 (dent quantity of the external edge)+b9 (dent quantity of the external edge)=b2=a2, and b1=a3×2 in Embodiment 2 shown in FIG. 10(a) (a ladder-shaped capacitor line) and in the comparative example shown in FIG. 10(b) (a capacitor line with the external edge partially dented inward).

The embodiments and examples described so far are for illustrative purposes only and by no means limit the scope of the disclosure. It is obvious to the person skilled in the art that many modifications and variations are possible based on the description.

General Description

Aspect 1
A display device including:
a plurality of pixel circuits each including a retention capacitor, a drive transistor, and an initialization transistor; and
a semiconductor layer, a gate insulation film, a first wiring layer, a first inorganic insulation film, a second wiring layer, a second inorganic insulation film, and a third wiring layer, all of which are provided on a substrate in a stated order, wherein
each of the plurality of pixel circuits includes:
an insular capacitor electrode in the first wiring layer;
a capacitor line extending in a row direction in the second wiring layer; and
a connection line in the third wiring layer, the connection line being electrically connected to one of conductive terminals of the initialization transistor and to the capacitor electrode,
the capacitor line is electrically connected to the capacitor lines of those two of the plurality of pixel circuits which are adjacent in the row direction,
the connection line is electrically connected to the capacitor electrode via a first contact hole in the first inorganic insulation film and the second inorganic insulation film,
each of the two of the plurality of pixel circuits has a first opening in the capacitor line around the first contact hole in a plan view,
the capacitor electrode and the capacitor line overlap in an overlapping region with the first inorganic insulation film intervening therebetween, the retention capacitor being provided in the overlapping region, and
the capacitor line has a second opening between those two of the first openings which are adjacent in the row direction and includes a first connecting line and a second connecting line opposite each other in a column direction across the second opening.

Aspect 2
The display device of, for example, aspect 1, wherein
the capacitor line has a first opposing portion and a second opposing portion opposite each other in the column direction across the first opening in a plan view,
the first connecting line has an external edge flush with an external edge of that first opposing portion which is adjacent in the row direction, and
the second connecting line has an external edge flush with an external edge of that second opposing portion which is adjacent in the row direction.

Aspect 3
The display device of, for example, aspect 2, wherein
the first connecting line and the first opposing portion have an equal width, and
the second connecting line and the second opposing portion have an equal width.

Aspect 4
The display device of, for example, aspect 2, wherein
the first connecting line has a smaller width than does the first opposing portion, and
the second connecting line has a smaller width than does the second opposing portion.

Aspect 5
The display device of, for example, aspect 3 or 4, wherein the width of the first connecting line is equal to the width of the second connecting line.

Aspect 6
The display device of, for example, any one of aspects 1 to 5, further including a data signal line overlapping the second opening.

Aspect 7
The display device of, for example, any one of aspects 1 to 6, wherein
the capacitor electrode is a control electrode of the drive transistor, and
the drive transistor has a larger channel width than a channel length.

Aspect 8
The display device of, for example, aspect 7, wherein the capacitor electrode has a larger dimension in a direction of the channel width than in a direction of the channel length.

Aspect 9
The display device of, for example, aspect 7, wherein the first opening has a larger dimension in a direction of the channel width than in a direction of the channel length.

Aspect 10
The display device of, for example, any one of aspects 1 to 9, wherein
the third wiring layer includes a first power supply line, and
the capacitor line is electrically connected to the first power supply line via a second contact hole in the second inorganic insulation film.

Aspect 11
The display device of, for example, aspect 10, wherein the first power supply line extends in the column direction and has a larger width in a portion thereof that overlaps the first opening than in a portion thereof that overlaps a gap between those two of the plurality of pixel circuits which are adjacent in the column direction.

Aspect 12
The display device of, for example, any one of aspects 1 to 11, wherein
each of the plurality of pixel circuits includes:
a plurality of parallel-connected drive transistors including the drive transistor; and
a plurality of capacitor electrodes including the capacitor electrode, the plurality of capacitor electrodes corresponding to the plurality of drive transistors, and
the two of the plurality of pixel circuits which are adjacent in the row direction share the capacitor lines overlapping the plurality of capacitor electrodes.

Aspect 13
The display device of, for example, aspect 12, wherein the plurality of capacitor electrodes is electrically connected to the connection line.

Aspect 14
The display device of, for example, aspect 12, wherein
the plurality of drive transistors includes a first transistor and a second transistor that line up in the column direction, and the first transistor and the second transistor share a source region in the semiconductor layer.

Aspect 15

The display device of, for example, aspect 14, wherein the plurality of drive transistors includes the first transistor, the second transistor, and a third transistor that line up in the column direction, and the second transistor and the third transistor share a drain region in the semiconductor layer.

Aspect 16

The display device of, for example, aspect 15, wherein the plurality of drive transistors includes the first transistor, the second transistor, the third transistor, and a fourth transistor that line up in the column direction, and the third transistor and the fourth transistor share the source region in the semiconductor layer.

The invention claimed is:

1. A display device comprising:
a plurality of pixel circuits each including a retention capacitor, a drive transistor, and an initialization transistor; and
a semiconductor layer, a gate insulation film, a first wiring layer, a first inorganic insulation film, a second wiring layer, a second inorganic insulation film, and a third wiring layer, all of which are provided on a substrate in a stated order, wherein
each of the plurality of pixel circuits includes:
an insular capacitor electrode in the first wiring layer;
a capacitor line extending in a row direction in the second wiring layer; and
a connection line in the third wiring layer, the connection line being electrically connected to one of conductive terminals of the initialization transistor and to the capacitor electrode,
the capacitor line is electrically connected to the capacitor lines of those two of the plurality of pixel circuits which are adjacent in the row direction,
the connection line is electrically connected to the capacitor electrode via a first contact hole in the first inorganic insulation film and the second inorganic insulation film,
each of the two of the plurality of pixel circuits has a first opening in the capacitor line around the first contact hole in a plan view,
the capacitor electrode and the capacitor line overlap in an overlapping region with the first inorganic insulation film intervening therebetween, the retention capacitor being provided in the overlapping region, and
the capacitor line has a second opening between those two of the first openings which are adjacent in the row direction and includes a first connecting line and a second connecting line opposite each other in a column direction across the second opening.

2. The display device according to claim 1, wherein the capacitor line has a first opposing portion and a second opposing portion opposite each other in the column direction across the first opening in a plan view,
the first connecting line has an external edge flush with an external edge of that first opposing portion which is adjacent in the row direction, and
the second connecting line has an external edge flush with an external edge of that second opposing portion which is adjacent in the row direction.

3. The display device according to claim 2, wherein the first connecting line and the first opposing portion have an equal width, and the second connecting line and the second opposing portion have an equal width.

4. The display device according to claim 2, wherein the first connecting line has a smaller width than does the first opposing portion, and
the second connecting line has a smaller width than does the second opposing portion.

5. The display device according to claim 3, wherein the width of the first connecting line is equal to the width of the second connecting line.

6. The display device according to claim 1, further comprising a data signal line overlapping the second opening.

7. The display device according to claim 1, wherein the capacitor electrode is a control electrode of the drive transistor, and
the drive transistor has a larger channel width than a channel length.

8. The display device according to claim 7, wherein the capacitor electrode has a larger dimension in a direction of the channel width than in a direction of the channel length.

9. The display device according to claim 7, wherein the first opening has a larger dimension in a direction of the channel width than in a direction of the channel length.

10. The display device according to claim 1, wherein the third wiring layer includes a first power supply line, and
the capacitor line is electrically connected to the first power supply line via a second contact hole in the second inorganic insulation film.

11. The display device according to claim 10, wherein the first power supply line extends in the column direction and has a larger width in a portion thereof that overlaps the first opening than in a portion thereof that overlaps a gap between those two of the plurality of pixel circuits which are adjacent in the column direction.

12. The display device according to claim 1, wherein each of the plurality of pixel circuits includes:
a plurality of parallel-connected drive transistors including the drive transistor; and
a plurality of capacitor electrodes including the capacitor electrode, the plurality of capacitor electrodes corresponding to the plurality of drive transistors, and
the two of the plurality of pixel circuits which are adjacent in the row direction share the capacitor lines overlapping the plurality of capacitor electrodes.

13. The display device according to claim 12, wherein the plurality of capacitor electrodes is electrically connected to the connection line.

14. The display device according to claim 12, wherein the plurality of drive transistors includes a first transistor and a second transistor that line up in the column direction, and
the first transistor and the second transistor share a source region in the semiconductor layer.

15. The display device according to claim 14, wherein the plurality of drive transistors includes the first transistor, the second transistor, and a third transistor that line up in the column direction, and
the second transistor and the third transistor share a drain region in the semiconductor layer.

16. The display device according to claim 15, wherein the plurality of drive transistors includes the first transistor, the second transistor, the third transistor, and a fourth transistor that line up in the column direction, and the third transistor and the fourth transistor share the source region in the semiconductor layer.

* * * * *